(12) United States Patent
Schmidt et al.

(10) Patent No.: US 9,949,404 B2
(45) Date of Patent: Apr. 17, 2018

(54) ELECTRIC DEVICE

(71) Applicant: SEW-EURODRIVE GMBH & CO. KG, Bruchsal (DE)

(72) Inventors: Josef Schmidt, Graben-Neudorf (DE); Martin Schömer, Bruchsal (DE)

(73) Assignee: SEW-EURODRIVE GMBH & CO. KG, Bruchsal (DE)

( * ) Notice: Subject to any disclaimer, the term of this patent is extended or adjusted under 35 U.S.C. 154(b) by 368 days.

(21) Appl. No.: 14/373,807

(22) PCT Filed: Jan. 9, 2013

(86) PCT No.: PCT/EP2013/000036
§ 371 (c)(1),
(2) Date: Jul. 22, 2014

(87) PCT Pub. No.: WO2013/107615
PCT Pub. Date: Jul. 25, 2013

(65) Prior Publication Data
US 2015/0029671 A1    Jan. 29, 2015

(30) Foreign Application Priority Data
Jan. 19, 2012 (DE) .................. 10 2012 000 907

(51) Int. Cl.
*H05K 5/00* (2006.01)
*H05K 7/20* (2006.01)
*H05K 7/02* (2006.01)

(52) U.S. Cl.
CPC ....... *H05K 7/20436* (2013.01); *H05K 5/0004* (2013.01); *H05K 5/0034* (2013.01); *H05K 7/02* (2013.01); *H05K 7/209* (2013.01); *H05K 7/20418* (2013.01)

(58) Field of Classification Search
CPC .... H01L 23/373; H05K 7/209; H05K 7/2039; H05K 5/0034; H05K 7/20445; G06F 1/20
See application file for complete search history.

(56) References Cited

U.S. PATENT DOCUMENTS

| 5,755,026 A * | 5/1998 | Stephan ................. H05K 3/284 29/825 |
| 7,813,134 B2 * | 10/2010 | Katsuro ............. H05K 7/20454 165/104.33 |
| 9,237,679 B2 * | 1/2016 | Schoerner ............ H05K 7/1432 |

(Continued)

FOREIGN PATENT DOCUMENTS

| CN | 101690437 A | 3/2010 |
| DE | 42 37 870 | 3/1994 |

(Continued)

OTHER PUBLICATIONS

International Search Report, dated Apr. 7, 2013, issued in corresponding International Application No. PCT/EP2013/000036.

(Continued)

Primary Examiner — Robert J Hoffberg
Assistant Examiner — Hung Dang
(74) Attorney, Agent, or Firm — Andrews Kurth Kenyon LLP

(57) ABSTRACT

An electric device having a printed circuit board fitted with components, and at least one foam component, the foam component surrounding the circuit board at least partially so as to form a housing.

15 Claims, 3 Drawing Sheets

(56) References Cited

U.S. PATENT DOCUMENTS

| | | | |
|---|---|---|---|
| 2009/0114369 A1* | 5/2009 | Kammerzell | F24F 12/006 165/47 |
| 2010/0142154 A1* | 6/2010 | Collet | H05K 7/20454 361/714 |
| 2010/0202110 A1 | 8/2010 | Becker et al. | |
| 2010/0218932 A1* | 9/2010 | Fischer | B32B 5/18 165/185 |
| 2012/0021148 A1* | 1/2012 | Thrush | B32B 3/02 428/33 |
| 2013/0314876 A1* | 11/2013 | Martin | H05K 7/1432 361/714 |

FOREIGN PATENT DOCUMENTS

| | | | |
|---|---|---|---|
| WO | 99/59225 | | 11/1999 |
| WO | WO2012/104017 | * | 1/2012 |
| WO | 2012/104016 | | 8/2012 |

OTHER PUBLICATIONS

International Search Report, dated Jun. 25, 2013, issued in corresponding International Application No. PCT/EP2013/000036.
International Preliminary Report on Patentability, dated Aug. 7, 2014, issued in corresponding International Application No. PCT/EP2013/000036.

* cited by examiner

ELECTRIC DEVICE

FIELD OF THE INVENTION

The present invention relates to an electric device.

BACKGROUND INFORMATION

It is common knowledge that foam plastic can be used as heat barrier. The housings of electric devices are produced from metal or plastic materials.

SUMMARY

Therefore, the present invention is based on the objective of further developing an electric device, which is able to be produced in the most uncomplicated manner possible.

Important features of the invention in the electric device, having a printed circuit board assembly and at least one foam component, include the foam component surrounding the circuit board at least partially so as to form a housing.

This has the advantage that the heat is dissipated through the foam component. The foam component thus does not function as a heat barrier, but as a heat-dissipating housing component. The capacity of the foam for absorbing impact energy is very high despite its low mass. It is therefore possible to obtain excellent protection for the circuit board.

As a result, the foam material itself, which acts as a heat sink for the heat-generating components, also functions as electrical insulator, contact protection and housing.

Here, a foam material describes foam plastic materials which have a volumetric component of gas inclusions or gas bubbles of more than 50%. During the foaming process, the addition of foaming agents causes a base material to be brought to a foaming phase, so that the volume of the material at least doubles. Preferably, hot water vapor is applied to globules of the foamed base material in a molding tool, so that the globules are heat-sealed, i.e., integrally connected, and the entire body is given the form predefined by the molding tool.

In one advantageous development, the foam material is made up of a foamed-up base material which includes polypropylene and a nonoxide ceramic material,
which includes silicon carbide, boron nitride and/or boron carbide, in particular,
in particular at a volumetric component of between 3% and 30%. This offers the advantage that a heat-conducting foam material is able to be produced using simple means.

In one advantageous development, one or more heat-generating component(s) is/are situated on the circuit board. This has the advantage that the heat is dissipated to the environment through the housing, despite the fact that the housing is made of foam material.

In one advantageous development, the foam components are interconnected in form-locking manner, especially by a screw connection or a clip-in connection. This advantageously provides a simple and secure connection.

In one advantageous development, the electric device is able to be screwed to an assembly part, especially a metallic assembly part, with the aid of screws that introduce a clamping force into a/the foam component. This is advantageous inasmuch as the assembly part is able to conduct the heat generated by the electric device.

In one advantageous development, a heat-generating power module which is connected to the circuit board is linked to a heat sink, especially an aluminum heat sink, on a side facing away from the circuit board; this heat sink penetrates a foam component and discharges into the environment, especially into the assembly part, on its side facing away from the power module. This advantageously makes it possible to shunt a large heat flow to the environment via a heat sink. The further heat flows generated by the electric device are able to be dissipated via the foam material.

In one advantageous development, the circuit board is provided with at least one plug connector part, which projects from a/the foam component, especially for a connection with a mating connector part. This has the advantage that electrical connections project from the foam material and are therefore contactable. The plug connector part is able to be fitted on the circuit board in an automated manner during its assembly, which enables an uncomplicated and cost-effective production.

In one advantageous development, the foam material includes a metallic part, especially a part made of aluminum or copper, which projects from the foam material into the environment and is set apart from the circuit board and the components assembled thereon. This advantageously makes it possible to achieve better heat dissipation. This is due to the fact that although the specific heat conductivity of the foam material is better than air, especially at least ten times better, it is poorer than that of copper and also aluminum.

In one advantageous development, the power module is connected to the circuit board by screws,
a pressure plate, in particular, being pressed against the circuit board by a screw connection on the side facing away from the power module, the power module being pressed against the circuit board by the screw connection. This advantageously generates low pressure in the contact region. The pressure plate is made of plastic or developed in two pieces, and an electrically insulating plastic part, which is pressed in the direction of the circuit board by a metal plate, is situated in the direction of the circuit board.

DETAILED DESCRIPTION

Figure 1:
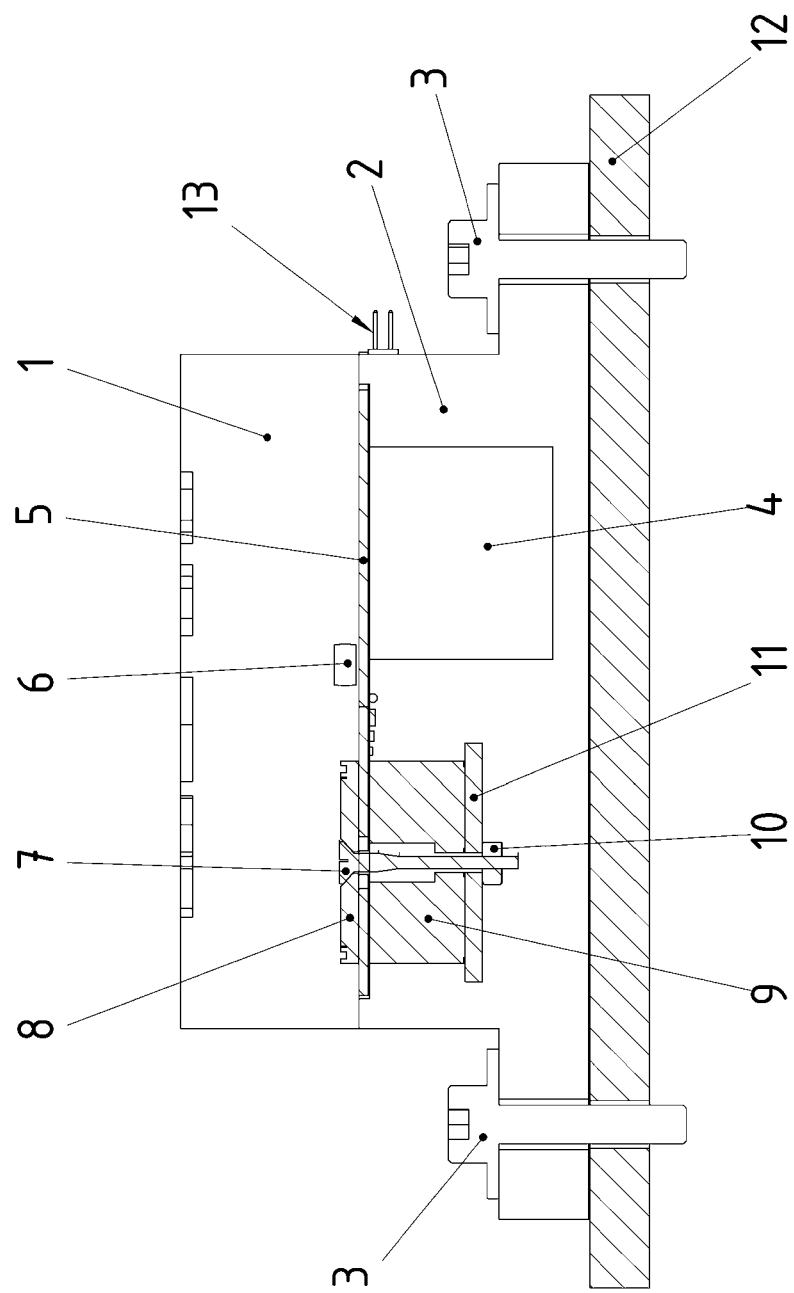
FIG. 1 shows a cross-section through the schematic structure of an exemplary embodiment of the present invention.

As illustrated in FIG. 1, a circuit board 5, on which a heat-generating component 6 is mounted, is surrounded by foam components (1, 2) on both sides.

For this purpose a first foam component 1 is placed against the first side of circuit board 5, on which component 6 is situated as well.

A power module 9, which is provided with power semiconductors and consequently generates a high heat output, is mounted on the other side of circuit board 5. Circuit board 5 together with power module 9 is surrounded by second foam component 2.

Both foam components (1, 2) simultaneously constitute the housing. That is to say, they surround the circuit board assembly in the form of a housing.

In addition, at least one, or both, foam component(s) (1, 2) is/are made from a heat-conductive base material.

The base material consists of polypropylene, a nonoxide ceramic material, such as silicon carbide, boron nitride and/or boron carbide, and additional additives for enhancing the flameproofing and reducing creeping currents, i.e., for improving the electrical insulating capability. The volumetric component of the ceramic material, which is added as a fine powder during the production, amounts to between 3% and 30%. Excellent thermal conductivity is therefore achievable, although the base material is expanded and thus is produced as a foam component having a high percentage of gas inclusions. Although the gas inclusions are poor heat conductors, the chains formed by the ceramic material particles are disposed as partially interrupted chains in the cell walls formed by the base material, from the heat source to the heat sink, in such a way that very low thermal resistivity is realizable by the foam component(s).

The foam components (1, 2) hold the circuit board assembly mechanically as well and are pressed against an assembly part 12, especially a table or wall, by screws 3, which preferably have a broadened screw head and/or under whose screw head a washer is disposed, in that screws 3 are at least partially screwed in there.

On the same side of circuit board 5 on which power module 9 is situated as well, a capacitor 4 is provided, which acts as intermediate circuit capacitor of the rectifier realized by the circuit board assembly.

Heat-generating component 6 is connected by soldering to circuit tracks of the circuit board via its connection elements.

In contrast, a screw 7 is provided to connect power module 9 to circuit board 5, the screw head pressing against a pressure plate 8, which, like the screw head, is situated on the side of the circuit board facing away from the power module.

To generate this clamping force, screw 7 is connected to a nut 10, which in turn presses on the power module via a pressure plate, nut 10 and pressure plate 11 being situated on the side of the power module that faces away from the circuit board.

Via a solder joint, a plug connector part is additionally connected to circuit board 5, whose contacts project from foam component 2, so that a mating plug part is able to be connected from the outside. In this way the circuit board can be connected to a data bus or to some other device by means of another data interface.

Figure 3:
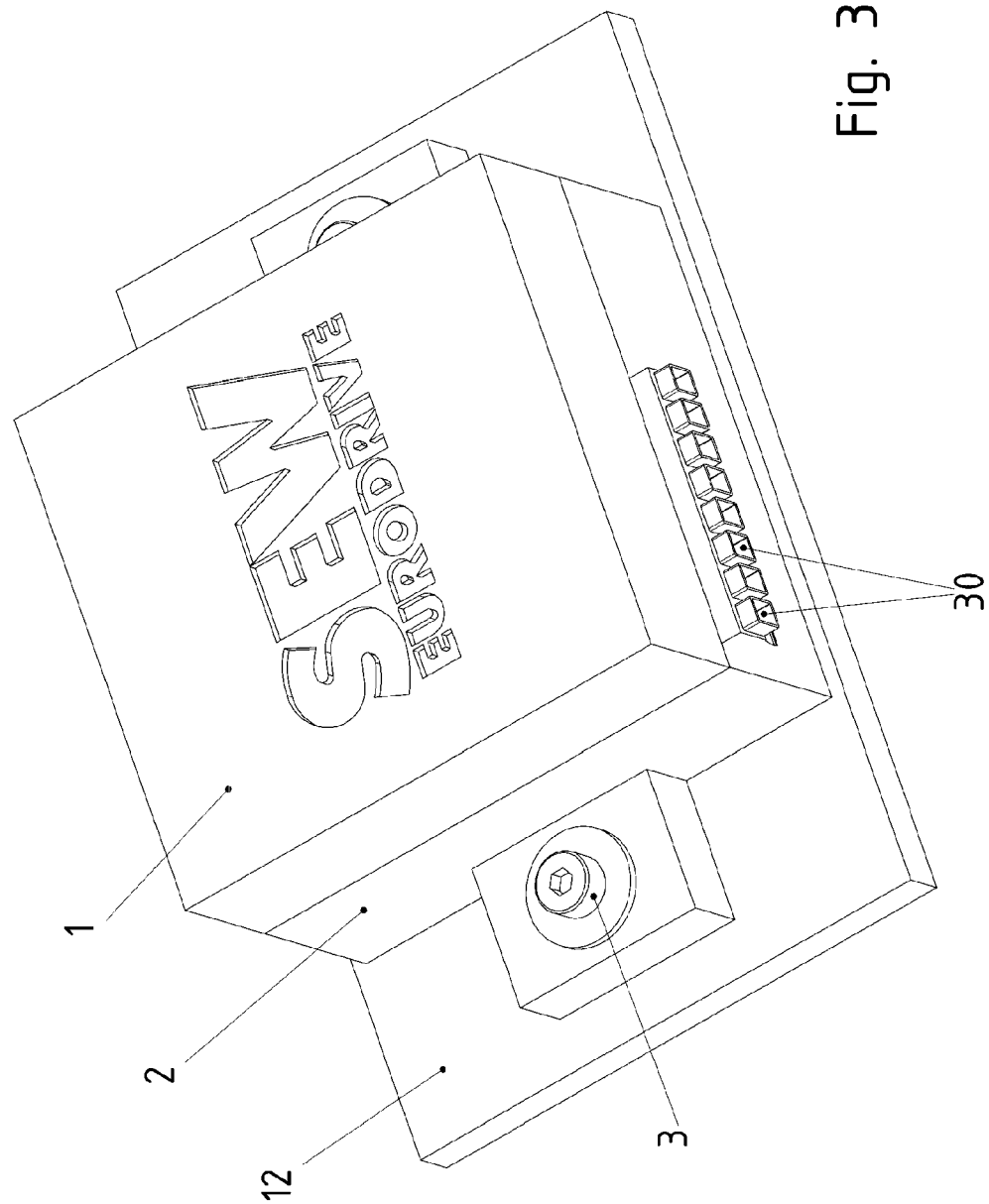
FIG. 3 shows an oblique view of the first or second exemplary embodiment.

As shown in FIG. 3, a further plug connector part 30 is additionally able to be soldered to circuit board 5, so that supply lines are connectible via a mating plug connector part which is likewise able to be connected to the contacts of the plug connector part 30 projecting from foam component 2.

In this manner, a circuit board is therefore able to be fitted with components, a module and plug connector parts, whereupon the circuit board assembly is enclosed by foam components, especially by correspondingly hot-stamped foam components.

The electric device created in this manner is able to be transported and fastened to an assembly part 12.

Instead of the foam components, an envelopment by foam in a tool is another option. For this purpose, for example, the circuit board is placed in the tool, surrounded by spherical base material particles, then exposed to the action of hot water vapor, chemically foamed up and/or foamed up using a multicomponent mixture.

This makes it possible to dispense with the production of individual foam material parts, and the housing can be produced in a single step.

Figure 2:
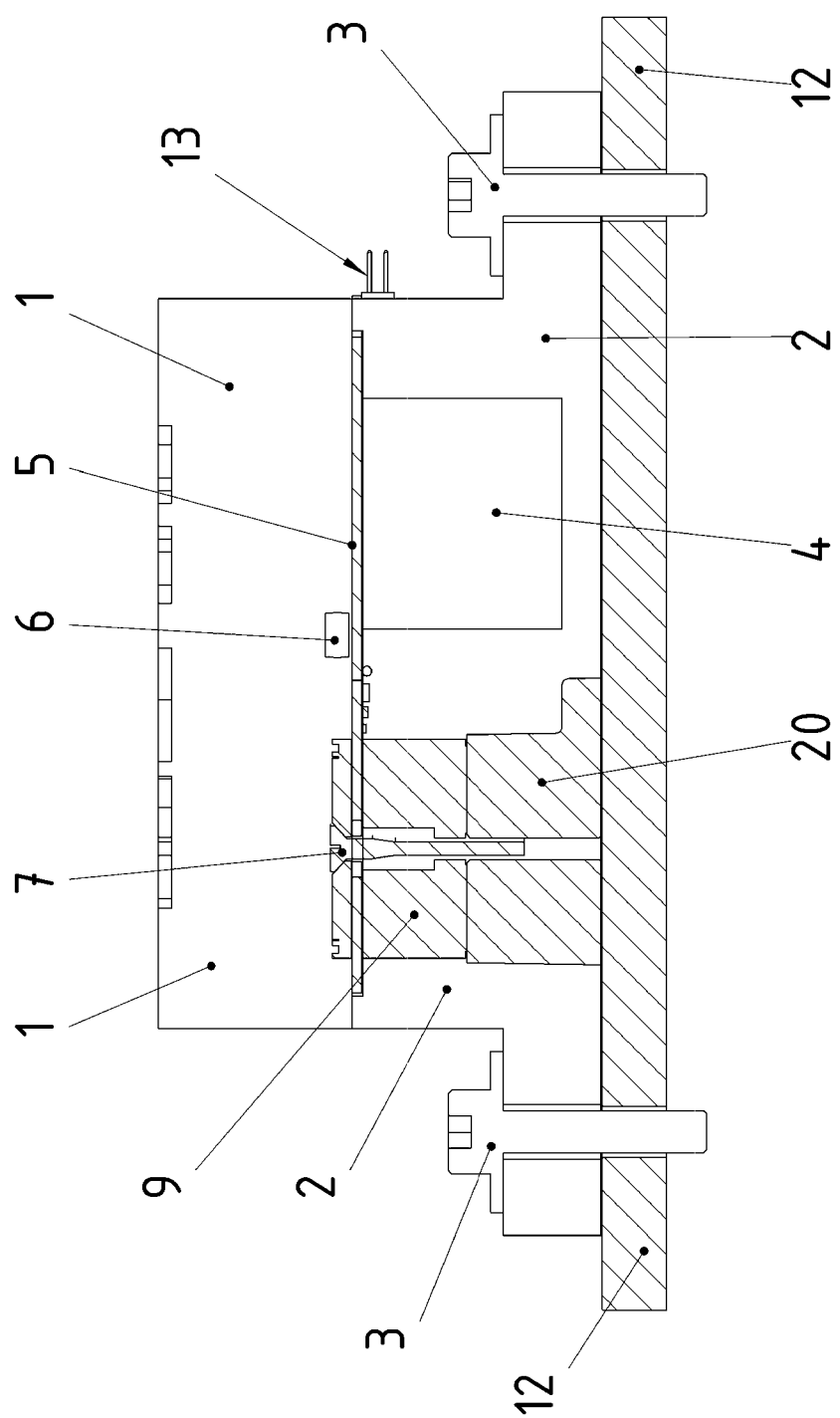
FIG. 2 shows a cross-section through the schematic structure of a second exemplary embodiment of the present invention.

As shown in FIG. 2, it is also possible to connect a heat sink 20 to power module 9, so that the heat of the power module is able to be routed out of the housing, formed by foam components (1, 2), into the environment, especially assembly part 12, by the direct contact of power module 5 with heat sink 20. The heat that is generated by component 6 and/or capacitor 4 is furthermore dissipated to the environment via heat-conducting foam components 1 or 2.

In one further exemplary embodiment according to the present invention, instead of the two foam components (1, 2), more or fewer foam material components are used to assume the housing function, the heat-conduction function, and the mechanical holding function for the circuit board and the components assembled thereon.

LIST OF REFERENCE NUMERALS 1 foam component, especially foam plastic component
2 foam component
3 screw, especially one having a broadened screw head and/or a washer
4 capacitor
5 circuit board
6 heat-generating component
7 screw
8 pressure plate
9 power module
10 nut
11 pressure plate
12 assembly part, especially a table or wall
13 plug connector part
20 heat sink
30 plug connector part

The invention claimed is:

1. An electric device, comprising:
a printed circuit board fitted with components including at least one foam component,
wherein the at least one foam component surrounds the circuit board at least partially so as to form a housing; and
wherein a metallic part is disposed in the foam component and projects from the foam component into the environment and is set apart from the circuit board and the components assembled thereon.

2. The electric device as recited in claim 1, wherein the at least one foam component includes an expanded base material that includes polypropylene and a nonoxide ceramic material, the nonoxide ceramic material including at least one of silicon carbide, boron nitride, and boron carbide.

3. The electric device as recited in claim 2, wherein the nonoxide ceramic material is present at a volumetric component of between 3% and 30%.

4. The electric device as recited in claim 1, wherein the circuit board is fitted with at least one heat-generating component.

5. The electric device as recited in claim 1, wherein the at least one foam component includes a plurality of foam components interconnected in form-locking manner.

6. The electric device as recited in claim 5, wherein the foam components are interconnected by one of a screwed connection and a clip-in connection.

7. The electric device as recited in claim 1, wherein the electric device is able to be screwed to an assembly part by screws that introduce a clamping force into the foam component.

8. The electric device as recited in claim 7, wherein the assembly part is metallic.

9. The electric device as recited in claim 7, further comprising:
a heat-generating power module linked to the circuit board and, on a side facing away from the circuit board, connected to a heat sink which penetrates the foam component and which discharges into an environment.

10. The electric device as recited in claim 9, wherein the heat sink is an aluminum heat sink.

11. The electric device as recited in claim 9, wherein the heat sink discharges into the assembly part, on a side of the assembly part facing away from the power module.

12. The electric device as recited in claim 1, wherein the circuit board includes at least one plug connector that projects from the foam component.

13. The electric device as recited in claim 12, wherein the plug connector is for a connection with a mating connector part.

14. The electric device as recited in claim 1, wherein the metallic part is one of aluminum and copper.

15. The electric device as recited in claim 9, wherein the power module is connected to the circuit board by screws, wherein a pressure plate is pressed against the circuit board by a screw connection on a side facing away from the power module, and wherein the power module is pressed against the circuit board by the screw connection.

* * * * *